(12) United States Patent
Zhang

(10) Patent No.: US 9,070,620 B2
(45) Date of Patent: Jun. 30, 2015

(54) METHOD OF FABRICATING DUAL TRENCH ISOLATED SELECTIVE EPITAXIAL DIODE ARRAY

(71) Applicant: Semiconductor Manufacturing International (Shanghai) Corporation, Shanghai (CN)

(72) Inventor: Chao Zhang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 14/203,500

(22) Filed: Mar. 10, 2014

(65) Prior Publication Data

US 2015/0102455 A1 Apr. 16, 2015

(51) Int. Cl.
| | |
|---|---|
| H01L 21/8238 | (2006.01) |
| H01L 21/336 | (2006.01) |
| H01L 27/24 | (2006.01) |
| H01L 45/00 | (2006.01) |
| H01L 29/06 | (2006.01) |
| H01L 27/092 | (2006.01) |

(52) U.S. Cl.
CPC .......... *H01L 27/2409* (2013.01); *H01L 45/16* (2013.01); *H01L 29/0649* (2013.01); *H01L 21/8238* (2013.01); *H01L 27/092* (2013.01)

(58) Field of Classification Search
USPC .......................................... 438/208, 218, 294
See application file for complete search history.

(56) References Cited

U.S. PATENT DOCUMENTS

| | | | | |
|---|---|---|---|---|
| 2006/0157815 | A1* | 7/2006 | Chang et al. | 257/500 |
| 2011/0316092 | A1* | 12/2011 | Yang et al. | 257/391 |
| 2013/0189799 | A1* | 7/2013 | Zhang et al. | 438/3 |

* cited by examiner

*Primary Examiner* — Khaja Ahmad
(74) *Attorney, Agent, or Firm* — Kilpatrick Townsend and Stockton LLP

(57) ABSTRACT

Methods and devices associated with phase change memory include diodes operating as selector switches having a large driving current and high switching speed. A method of forming a semiconductor device includes providing a semiconductor substrate, defining a diode array region and a peripheral region on the semiconductor substrate, forming an N+ buried layer in the diode array region by performing an ion implantation process and an annealing process. The method also includes forming a semiconductor epitaxial layer on the N+ buried layer, forming deep trench isolations through the epitaxial layer and the N+ buried layer into a portion of the substrate in the first direction, and forming shallow trench isolations in the diode array region and in the peripheral region in the second direction. The shallow trench isolation has a depth equal to or greater than a thickness of the epitaxial layer.

14 Claims, 11 Drawing Sheets

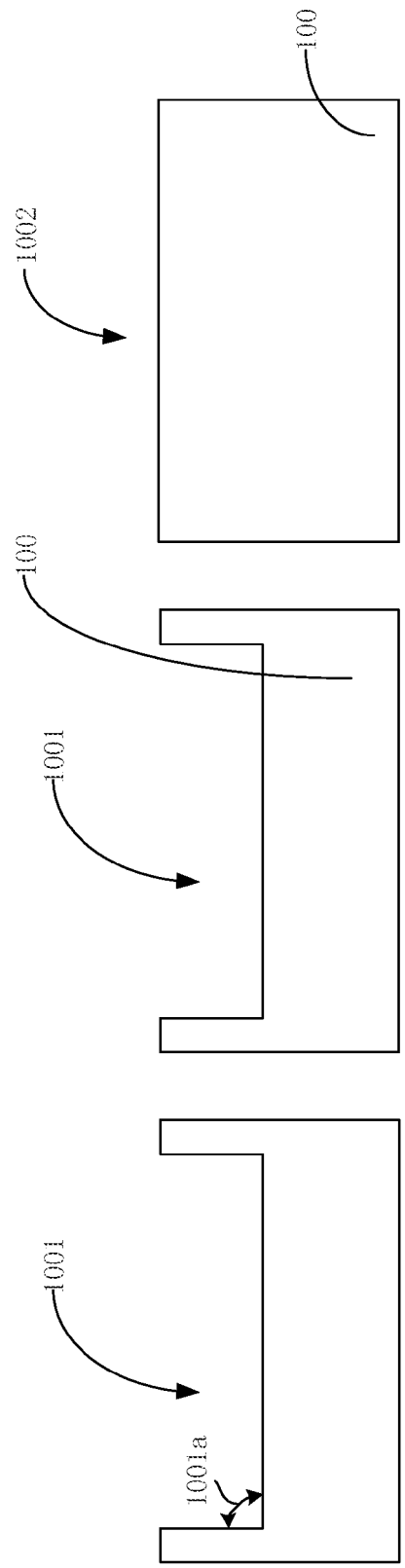

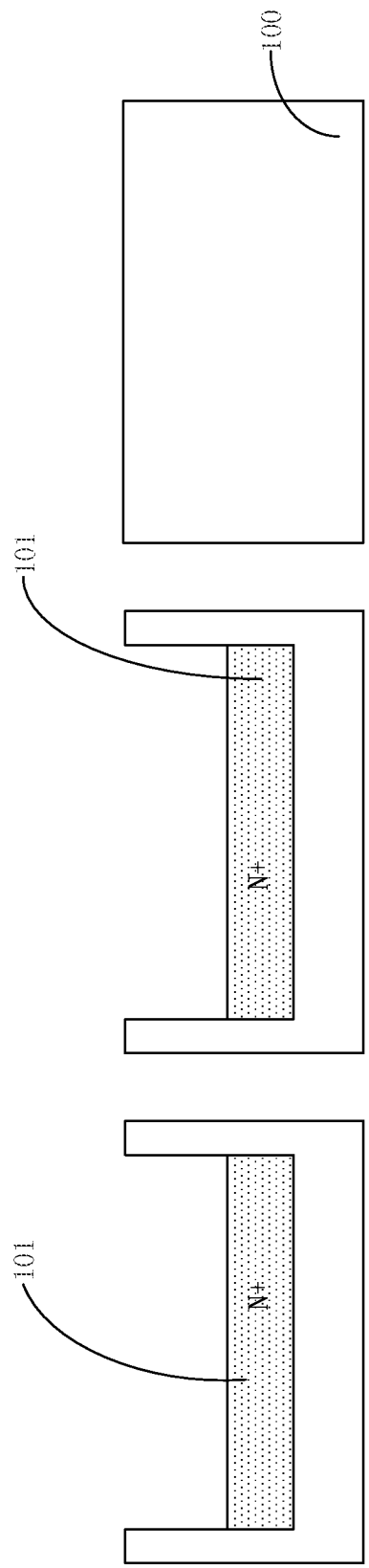

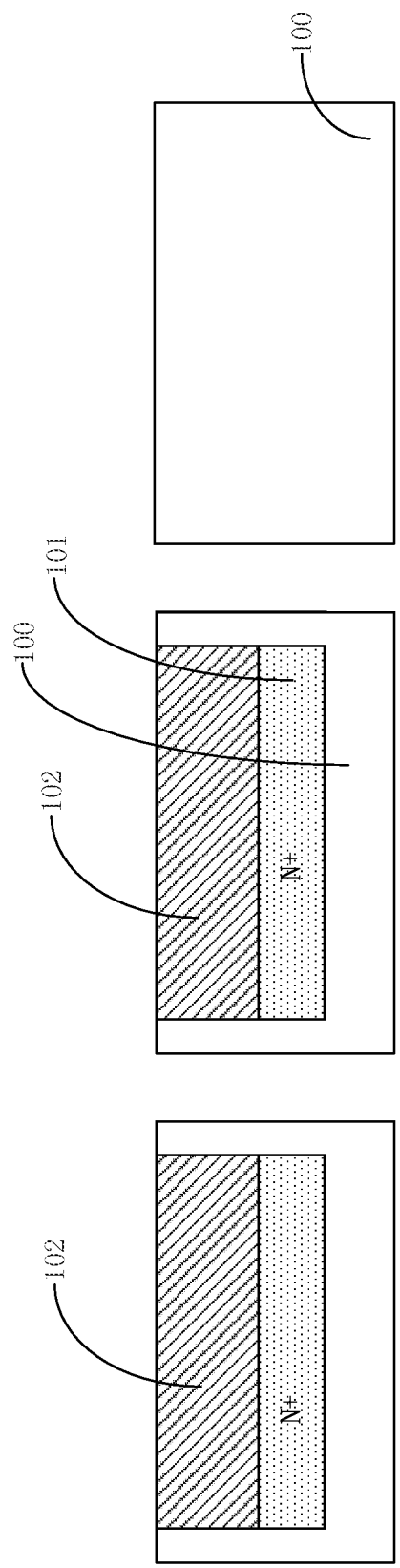

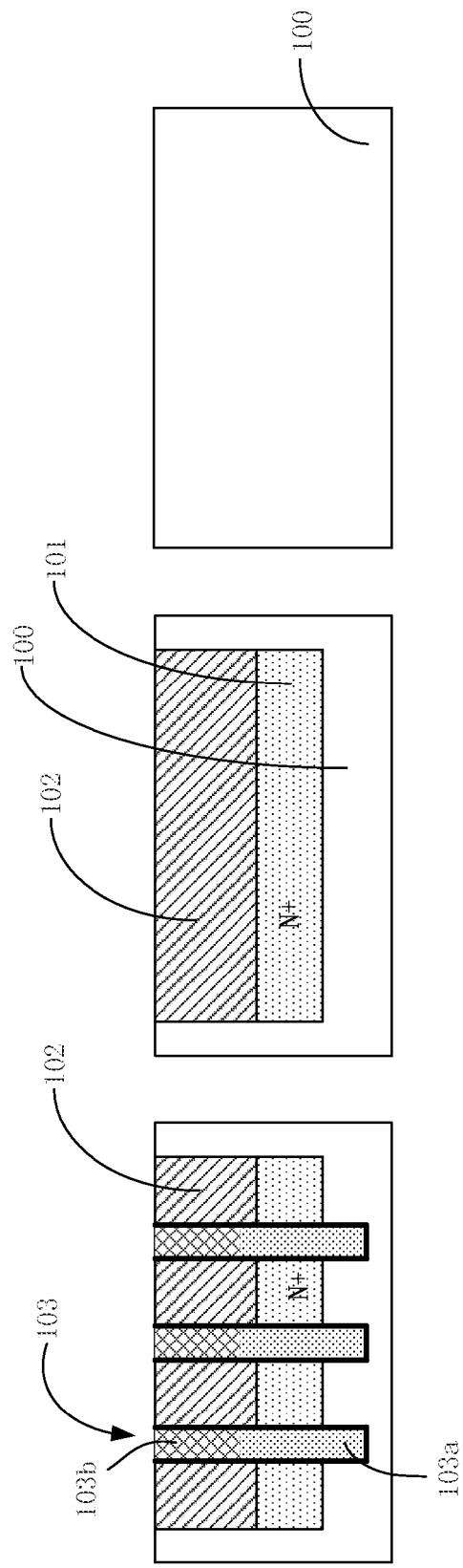

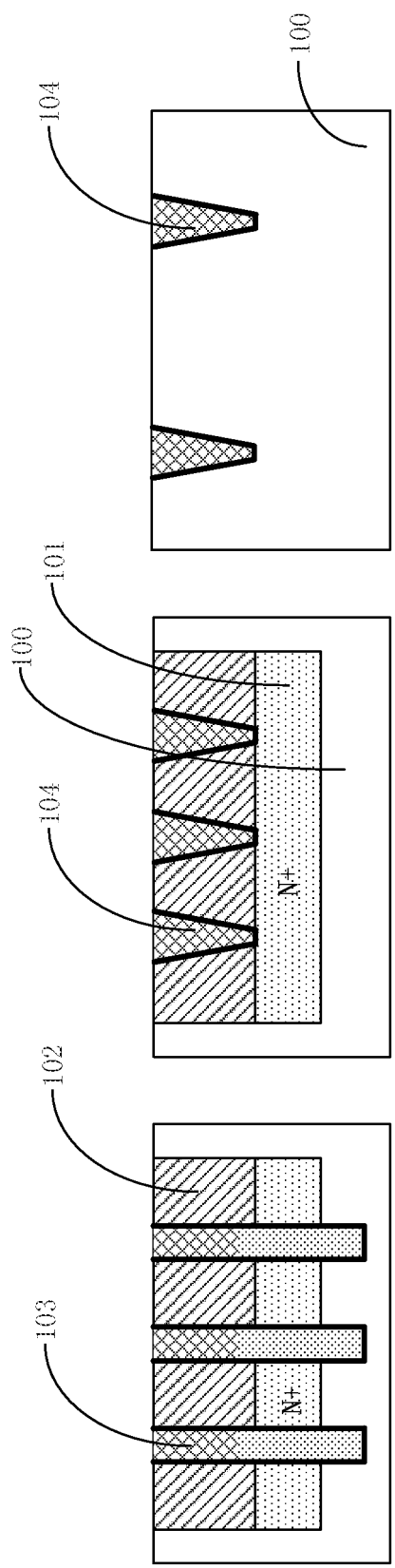

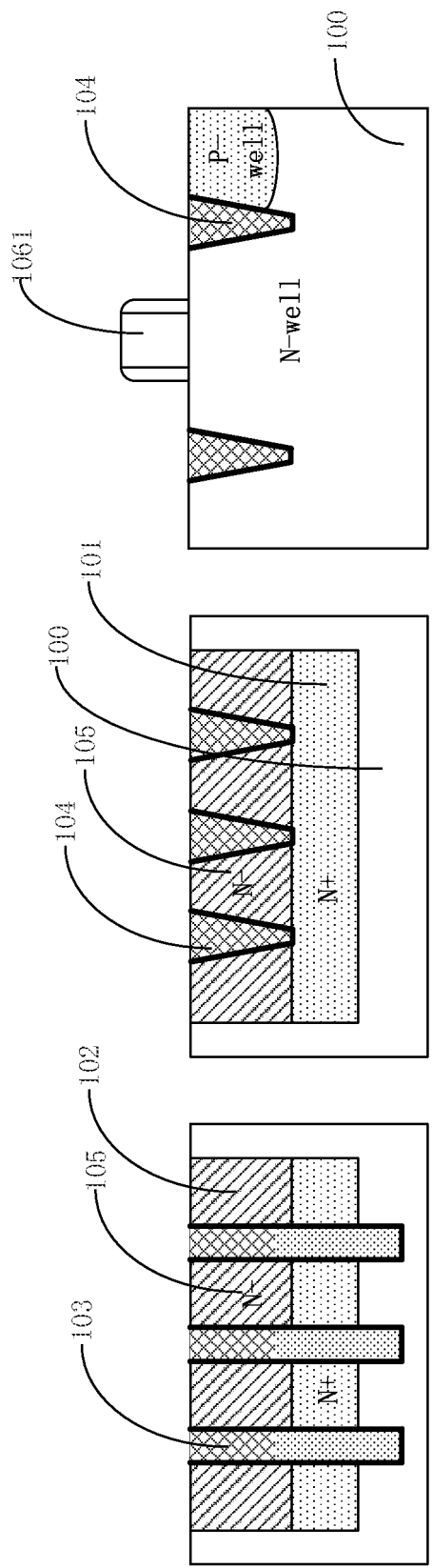

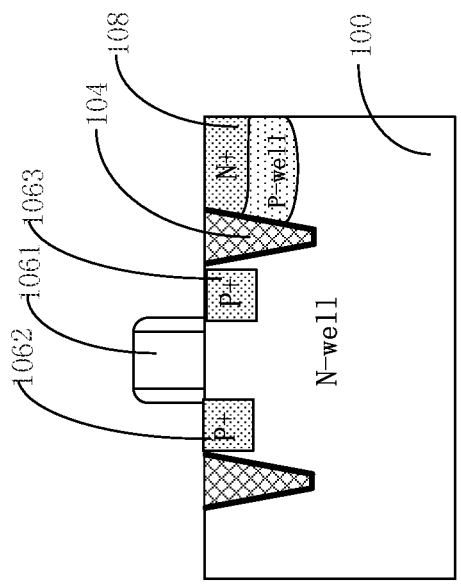
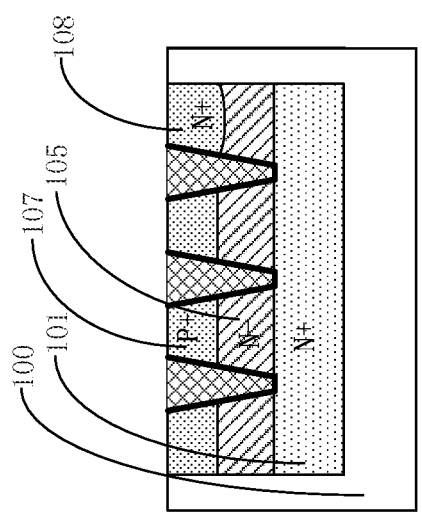
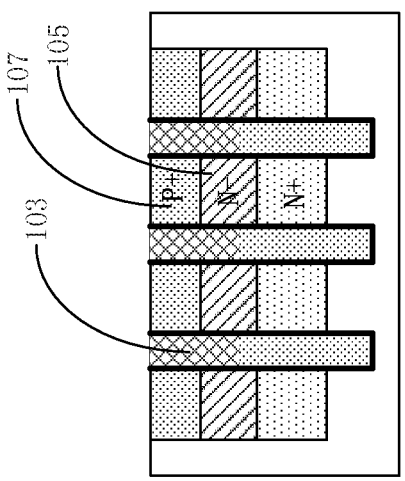

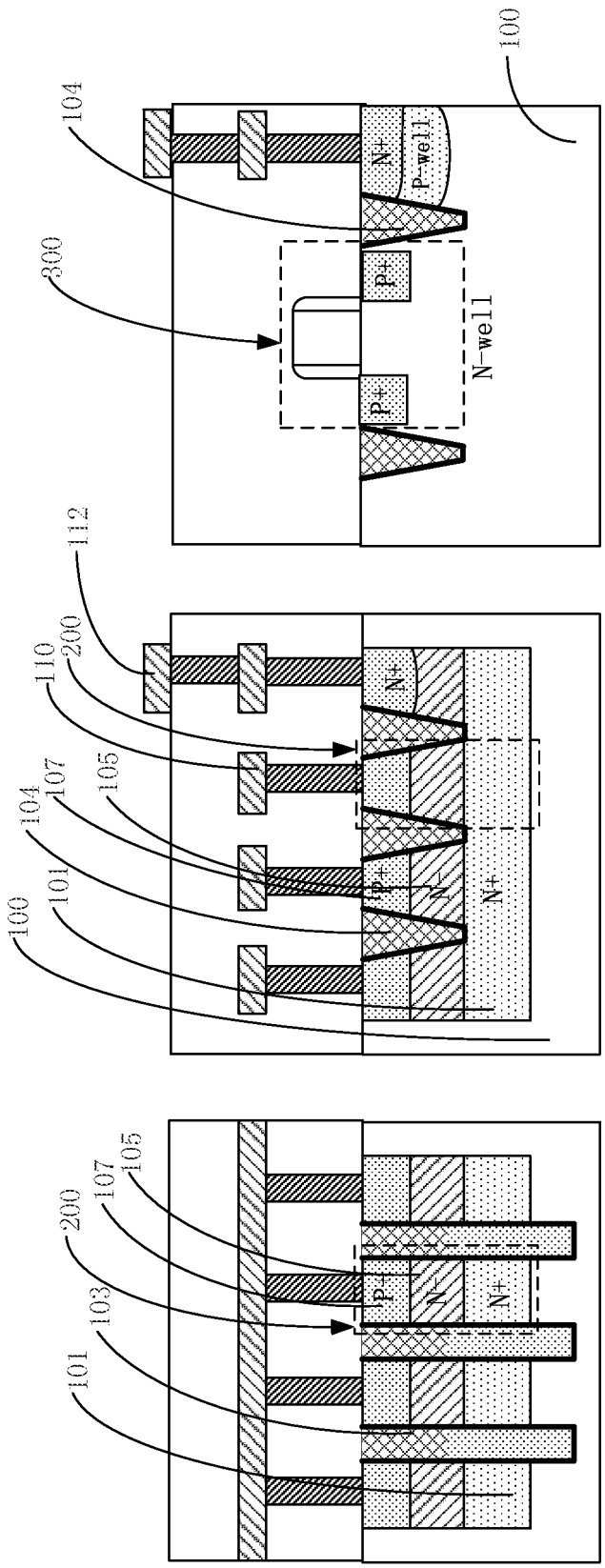

METHOD OF FABRICATING DUAL TRENCH ISOLATED SELECTIVE EPITAXIAL DIODE ARRAY

CROSS-REFERENCES TO RELATED APPLICATIONS

This application claims priority to Chinese Application No. 201310473657.5, filed on Oct. 11, 2013 with the State Intellectual Property Office of People's Republic of China, the content of which is incorporated herein by reference in its entirety.

FIELD OF THE INVENTION

The present invention relates to semiconductor memory devices. More particularly, embodiments of the present invention provide methods and devices of an array of diodes operating as selector switches for a phase change memory device, the diodes have a large driving current, high switching speed, and small reverse leakage current.

BACKGROUND OF THE INVENTION

A phase change memory (PCM) device is a type of non-volatile memory device, which is widely used in electronic appliances due to its numerous advantages such as fast read/write access times, read/write operations in a large number of times, long data retention time, and small unit area. It was once thought that there were no physical limitations for the size reduction of phase change memory cells down to 20 nm process nodes. However, the size reduction is limited by the driving current required to drive the phase change memory device. One way of reducing the size of the phase change memory device is to use a device that can provide a large driving current as a selector for the phase change memory device. In general, bipolar transistors can drive a larger current than CMOS transistors. However, bipolar transistors require a more complex design and increase the size of the chip. Also, integrating bipolar transistors with CMOS transistors result in more complex manufacturing processes.

As it can be seen, a selector (alternatively referred to as a diode) is the bottleneck for the integration with process nodes below 40 nm.

Current phase-change memory devices use diodes as selectors (alternatively referred to as selector switches) that can be controlled down to $6F^2$ (F is the feature size) with 90 nm process node and capable of providing a driving current of 1.5 mA. This type of phase-change design is expected to be applied to 22 nm process nodes. However, the diode manufacturing process is not compatible with standard CMOS processes, so that the diodes are manufactured in separate processes (for example, EPI) after the manufacture of the CMOS device. In other words, conventional manufacturing processes are very complex, which lower the yield and performance of the device. Furthermore, since the CMOS device is manufactured first, a subsequent ion implantation of the diode processes (e.g., implanting arsenic ions into the substrate) may adversely affect the CMOS device.

Thus, the challenge is to fabricate a diode array using conventional CMOS process techniques that reduce interference between adjacent word lines and bit lines. There exists a need for a method of manufacturing a phase-change memory device having a diode array with low cross-talk noises.

BRIEF SUMMARY OF THE INVENTION

In an effort to solve the aforementioned needs, embodiments of the present invention provide a method and device to increase the driving current and the switching speed of the diode (selector, selector switch) while minimizing interference or crosstalk noise between the diode and peripheral CMOS devices. The method may include providing a p-type semiconductor substrate, defining a diode array region and a peripheral device region on the semiconductor substrate, forming an N+ buried layer in the diode array region by performing an ion implantation process and an annealing process, and forming a semiconductor epitaxial layer on the N+ buried layer. The method may further include forming a deep trench isolation through the epitaxial layer and the N+ buried layer into a portion of the substrate in a first (column) direction, and forming a shallow trench isolation in the diode array region in a second (row) direction and a shallow trench isolation in the peripheral region in the second direction. In an embodiment, the first direction may be the word line direction and the second direction may be the bit line direction. The shallow trench isolation has a depth equal to or greater than a thickness of the epitaxial layer. The method also includes forming a well region and a gate electrode of a CMOS device in the peripheral region, forming a source and a drain of the CMOS device, forming a P+ layer in the epitaxial layer, and forming an N+ contact region in the diode array region and in the peripheral device region.

In an embodiment, defining the diode array region and peripheral device region may include forming a groove having sidewalls and a bottom surface by etching the semiconductor substrate. The groove may be defined as the diode array region, and the region outside of the groove may be defined as the peripheral device region.

In an embodiment, the groove may have a depth in a range between 100 nm and 600 nm, and the sidewalls intercept the bottom surface at an angle between 80 and 90 degrees.

In an embodiment, performing an ion implantation and an annealing process may include forming a lightly doped p-type material on a portion of the diode array region, forming a heavily doped n-type material on the portion of the diode array region, and activating the lightly doped p-type material and the heavily doped n-type material by annealing to form the N+ buried layer. In an embodiment, the lightly doped p-type material may include boron (B), boron fluoride ($BF_2$), or any combination thereof. The heavily doped n-type material may include arsenic (As), phosphorus (P), antimony (Sb), or any combination thereof.

In an embodiment, the annealing process is at a temperature in a range between 950° C. and 1150° C. with a time duration in a range between 10 seconds and 7200 seconds.

In an embodiment, forming a semiconductor epitaxial layer may include a deposition process at a temperature in a range between 950° C. and 1100° C. and with dimethyl dichlorosilane as a reaction gas.

In another embodiment, forming a semiconductor epitaxial layer may include a deposition process at a temperature in a range between 500° C. and 900° C. and with a silane ($SiH_4$) or dimethyl dichlorosilane ($Si_2H_2Cl_2$) as a reaction gas.

In an embodiment, the deep trench isolation includes an undoped polysilicon layer disposed on the bottom surface and an oxide layer disposed on the undoped polysilicon layer. The deep trench isolation has a depth of greater than 0.6 microns (um).

In an embodiment, the shallow trench isolation in the diode region and the shallow trench isolation region are formed concurrently.

In an embodiment, the method further includes forming an intermediate layer doped with N− dopants. The intermediate N-type doped layer is disposed below the P+ layer.

In an embodiment, the intermediate layer is formed by auto-diffusion of the N+ buried layer.

In one embodiment, forming a source and drain of the CMOS device may include ion implanting with P+ ions. The P+ ions can be concurrently implanted into the diode array region and into the peripheral device region. Forming a source and drain of the CMOS device may also include ion implanting with N+ ions. The N+ ions can be concurrently implanted into the diode array region and into the peripheral device region.

In another embodiment, the P+ layer in the diode array region and the source and drain of the CMOS device in the peripheral device region can be separately formed. The N+ layer in the diode array region and the source and drain of the CMOS device in the peripheral device region can also be separately formed.

In an embodiment, the P+ layer is a shallow junction.

In an embodiment, the method may further include forming bit lines and word lines. The bit lines are connected to the P+ layer, and the word lines are connected to the N+ buried layer.

Embodiments of the present invention also provide a semiconductor device. The semiconductor device may include a p-type semiconductor substrate, a diode array region having a plurality of diodes each operating as a selector switch of a phase change memory device, deep trench isolations and shallow trench isolations disposed around the diodes, and a peripheral device region on the semiconductor substrate. The diodes are separated and isolated by the deep trench isolations and the shallow trench isolations from each other.

In an embodiment, a diode array region includes an N+ buried layer overlying the semiconductor substrate and a P+ layer overlying the N+ buried layer.

In an embodiment, the diode array region may also include an N− layer disposed between the P+ layer and the N+ buried layer.

In an embodiment, the semiconductor device may also include a deep trench isolation surrounding the diode array region to isolate the diode array region from the peripheral device region.

Embodiments of the present invention also provide an electronic device that includes the semiconductor device described above.

The following description, together with the accompanying drawings, will provide a better understanding of the nature and advantages of the claimed invention.

BRIEF DESCRIPTION OF THE DRAWINGS

FIGS. 1A through 1H illustrate simplified cross-sectional views of various process stages associated with forming a semiconductor device according to a first embodiment of the present invention;

FIG. 3 is a simplified cross-sectional view of a semiconductor device according to a second embodiment of the present invention.

DETAILED DESCRIPTION OF THE INVENTION

Figures 1, 1H, 2, 3:
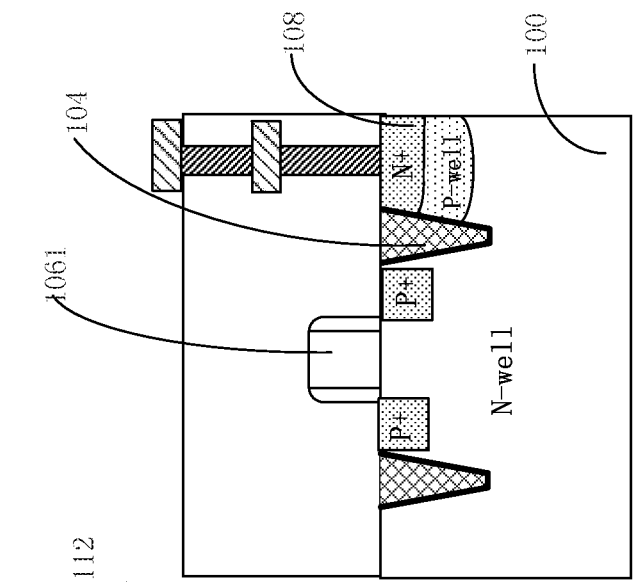
Figure 1H:
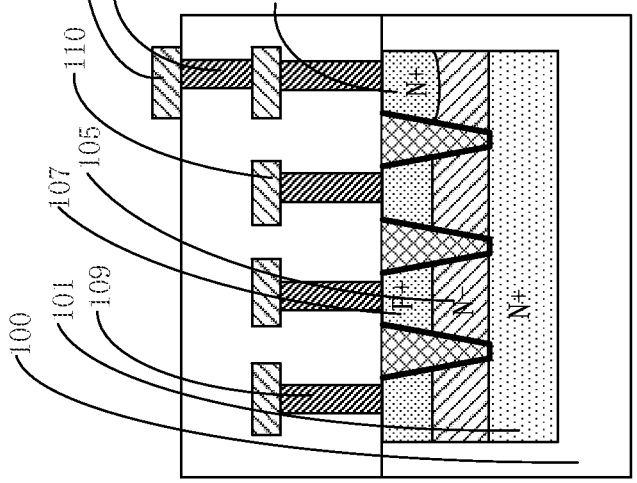
Figures 1, 1H, 2, 3:
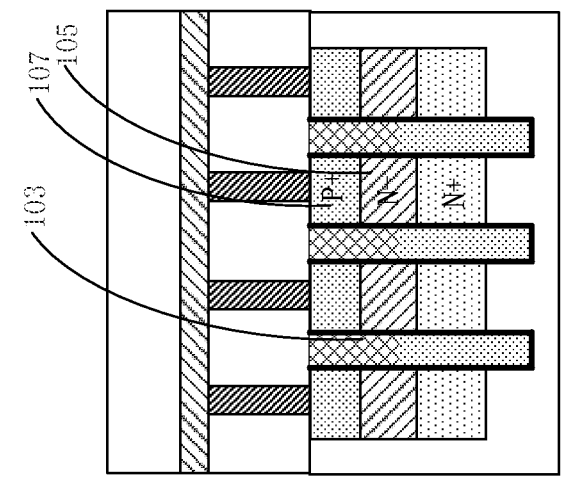

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and the are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

The N+(or n+) layer is highly doped with impurities to a concentration of at least 10E18 ($10^{18}$) atoms per $cm^3$. The N− (or n−) layer has a lower doping concentration, but is still an n-type and has an impurity concentration in the range of 10E14 to 10E15 ($10^{14}$ to $10^{15}$) atoms per $cm^3$. The P (or p) layer is lightly doped with impurities to a concentration in the range of 10E14 to 10E15 ($10^{14}$ to $10^{15}$) atoms per $cm^3$. The P+(or p+) layer is highly doped with impurities to a concentration of at least 10E18 ($10^{18}$) atoms per $cm^3$.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

First Embodiment

FIGS. 1A through 1H illustrate process steps associated with a method of manufacturing phase change memory cells in accordance with a first embodiment of the present invention. The method may use conventional processes for manufacturing a standard CMOS device, which includes a diode array region and a peripheral device region (alternatively referred to as peripheral region hereinafter) that contains a conventional CMOS device.

Figure 1I:
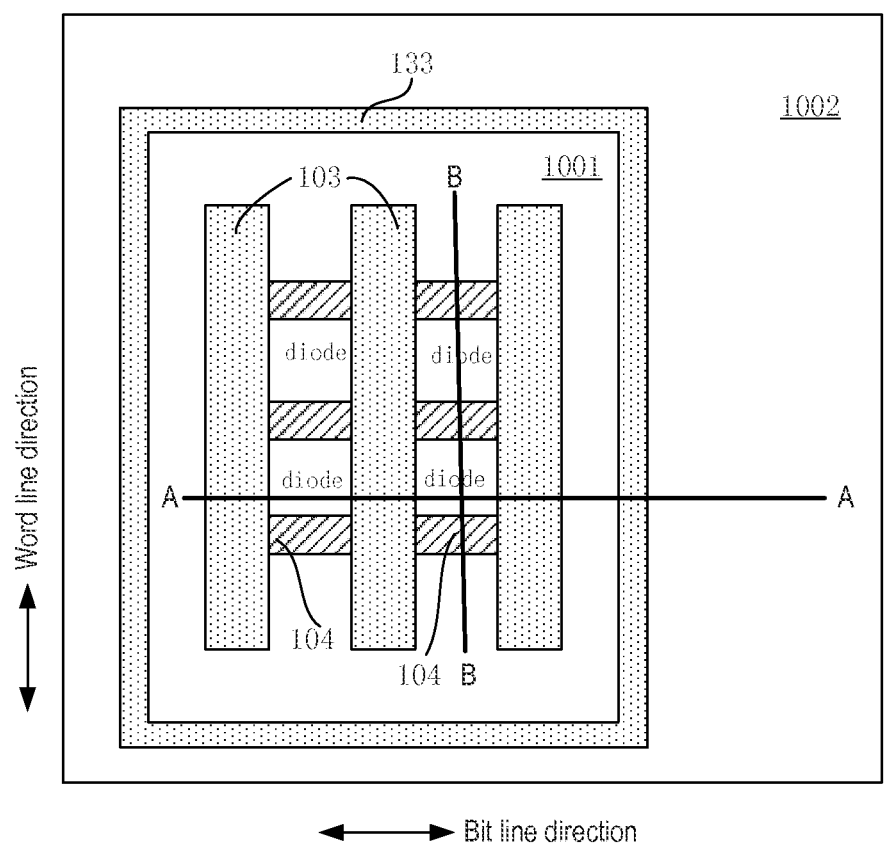
FIG. 1I is a top view of a semiconductor device according to some embodiments of the present invention.
Figure 2:
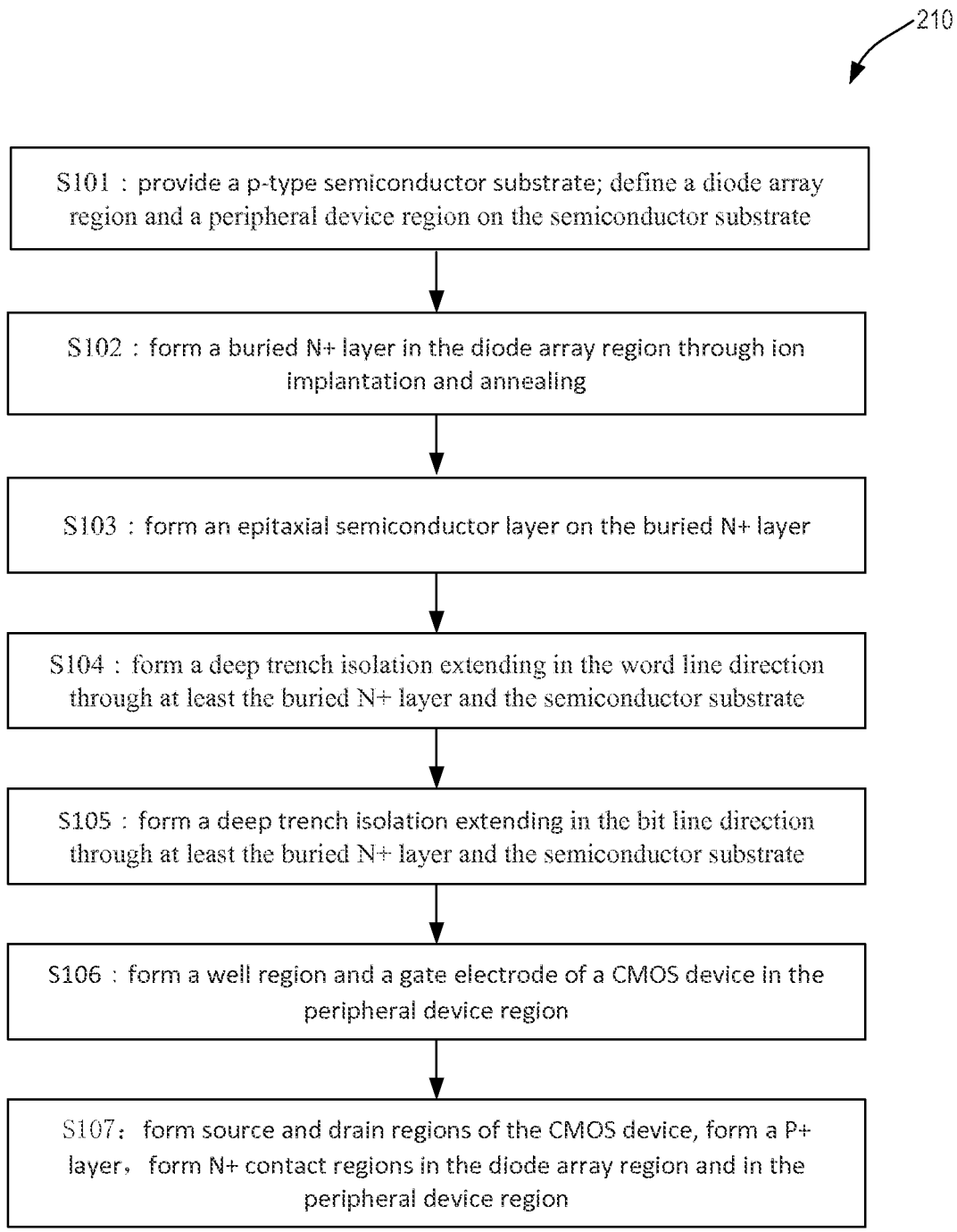
FIG. 2 is a simplified flow chart of a method of manufacturing a semiconductor device according to an embodiment of the present invention.

FIG. 1I is a top view of a CMOS device containing a diode array region and a peripheral region according to some embodiments of the present invention.

FIG. 2 is a flow chart of a method of manufacturing a semiconductor device according to the first embodiment of the present invention. The method may include the following steps:

A1: provide a p-type semiconductor substrate 100, and define a diode array region 1001 and a peripheral region 1002, as shown in FIG. 1A and FIG. 1I. FIG. 1A includes FIGS. 1A-1 through 1A-3. FIG. 1A-1 illustrates a cross-sectional view of diode array region 1001 cut along the A-A line (along the row direction). FIG. 1A-2 illustrates a cross-sectional view of diode array region 1001 cut along the B-B line (along the column direction). In one embodiment, the row direction is the bit line direction, and the column direction is the word line direction, as shown in FIG. 1I. FIG. 1A-3 illustrates a cross-sectional view of peripheral region 1002 cut along the A-A line. Similarly, in the following, FIG. 1B includes FIGS. 1B-1 through 1B-3 illustrating respective cross-sectional views of diode array region 1001 along the direction of the bit line and the word line, and peripheral region 1002 in a sequential process step. FIG. 1C includes FIGS. 1C-1 through 1C-3 illustrating respective cross-sectional views of diode array region 1001 along the direction of the bit line and the word line, and peripheral region 1002 in a sequential process step. FIG. 1D includes FIGS. 1D-1 through 1D-3 illustrating respective cross-sectional views of diode array region 1001 along the direction of the bit line and the word line, and peripheral region 1002 in a sequential process step. FIG. 1E includes FIGS. 1E-1 through 1E-3 illustrating respective cross-sectional views of diode array region 1001 along the direction of the bit line and the word line, and peripheral region 1002 in a sequential process step. FIG. 1F includes FIGS. 1F-1 through 1F-3 illustrating respective cross-sectional views of diode array region 1001 along the direction of the bit line and the word line, and peripheral region 1002 in a sequential process step. FIG. 1G includes FIGS. 1G-1 through 1G-3 illustrating respective cross-sectional views of diode array region 1001 along the direction of the bit line and the word line, and peripheral region 1002 in a sequential process step. FIG. 1H includes FIGS. 1H-1 through 1H-3 illustrating respective cross-sectional views of diode array region 1001 along the direction of the bit line and the word line, and peripheral region 1002 in a sequential process step.

In this embodiment, diode array region 1001 denotes the region of the diode array of a change phase random access memory device (PCRAM), peripheral region 1002 denotes the region of a conventional CMOS device and other devices, such as NMOS devices, PMOS devices, capacitive elements, resistive elements, sensors, and the like.

In an exemplary embodiment, step A1 may include forming a groove (a depressed portion) in semiconductor substrate 100 and defining the groove as diode array region 1001 and defining the region outside the trench as peripheral region 1002 (see FIGS. 1A and 1I).

In an embodiment, the groove may have a depth of about 100 nm to 600 nm and sidewalls intersecting the groove bottom surface at an angle 1001a in a range between about 80 to about 90 degrees.

The method also includes forming a buried N+ layer 101 in diode array region 1001 by ion implantation and annealing, as shown in FIG. 1B (step A2). In an exemplary embodiment, the buried N+ layer 101 may be formed with the following processes:

A21: deposit a lightly doped P-type conductive material in the lower portion of diode array region 1001;

A22: deposit a heavily doped N-type conductive material in the upper portion of diode array region 1001 overlying the lightly doped P-type conductive material;

A23: form the buried N+ layer by activating the lightly doped P-type conductive material and the heavily doped N-type conductive material by annealing.

In an embodiment, the lightly doped P-type conductive material includes boron (B), boron fluoride ($BF_2$), or a combination thereof. The heavily doped N-type conductive material includes As, P, Sb, or any combination thereof. Annealing is performing at a temperature in the range between 950° C. to 1150° C. and for a period of time between 10 seconds to 7200 seconds.

The method also includes forming an epitaxial semiconductor layer 102 overlying buried N+ layer 101 in diode array region 1001 by ion implantation and annealing, as shown in FIG. 1C (step A3).

In an exemplary embodiment, the epitaxial layer 102 may be formed using a deposition process at a temperature in the range between 950° C. to 1100° C., with a reaction gas of dimethyl dichlorosilane (DCS), with chemical formula $Si_2H_2Cl_2$.

In another embodiment, the epitaxial layer 102 may be formed using a deposition process at a temperature in the range between 500° C. to 900° C., with a reaction gas of silane ($SiH_4$) or dimethyl dichlorosilane ($Si_2H_2Cl_2$).

The method also includes forming a deep trench isolation 103 along the column direction (e.g., word line direction in FIG. 1I), the deep trench goes through at least epitaxial layer 102 and buried N+ layer 101, as shown in FIG. 1D (step A4).

In an exemplary embodiment, forming deep trench isolation 103 may include etching the epitaxial layer, the buried N+ layer and a portion of the semiconductor substrate to form a trench, filling the trench with isolation materials, and performing a chemical mechanical polishing (CMP) process on the isolation materials.

In an embodiment, deep trench isolation 103 includes undoped polycrystalline silicon 103a at the bottom portion and an oxide layer 103b at the upper portion. Comparing with a trench having only a single oxide layer, the two-layer structure of deep trench isolation 103 provides a better isolation. In order to obtain a better isolation, the upper surface of the undoped polycrystalline silicon 103a at the bottom portion is higher than the height (thickness) of the buried N+ layer 101. In an embodiment, deep trench isolation 103 has a depth (height) of about 0.6 um.

In an embodiment, step A4 may also include entirely surrounding diode array region 1001 with deep trench isolation 133. In other words, in the top view, the deep trench isolation 133 has a periphery (or surface area) larger than the periphery (surface area) of the diode array region 1001 so that the diode array region 1001 is completely disposed within the periphery of the deep trench isolation. Completely surrounding the diode array region 1001 by the deep trench isolation 133 may prevent interferences between the diode array region and the peripheral region, thereby achieving a better performance.

The method also includes forming a shallow trench isolation 104 along the row direction (e.g., the bit line direction of FIG. 1I) in the diode array region and in the peripheral region, as shown in FIG. 1E (step A5).

In an exemplary embodiment, forming shallow trench isolation 104 may include forming a shallow trench by etching the epitaxial layer and the semiconductor substrate, forming an isolation pad layer in the shallow trench, filling the shallow trench with isolation materials, and performing a chemical mechanical polishing (CMP) process on the isolation materials. In an embodiment, the isolation pad layer includes an oxide material. The isolation materials may include oxide materials. In an embodiment, a mask of silicon nitride (SiN) may be formed on the epitaxial layer prior to etching the epitaxial layer.

In an embodiment, the shallow trench isolation 104 can be concurrently formed in the diode array region and in the peripheral region. The shallow trench isolation 104 may have a depth that is equal to or greater than the thickness of the epitaxial layer 102.

Since deep trench isolation 103 extends in the column direction and shallow trench isolation 104 extends in the row direction, they are orthogonal to each other. The orthogonal relationship facilitates the isolation in subsequent processes of the diode array region according to embodiments of the present invention.

The method also includes forming an N– layer 105 in epitaxial layer 102 of diode array region 1001, and forming an N-well and a gate electrode 1061 in peripheral region 1002, as shown in FIG. 1F (step A6).

In an embodiment, forming N– layer 105 may include performing an N-type ion implantation onto a portion of epitaxial layer 102, or automatically diffusing N+ ions of the buried N+ layer 101 into the epitaxial layer 102.

In an embodiment, N– layer 105 may prevent the formation of reverse leakage current of the diode array operating as a selection switch. In certain conditions where the device performance can be met, the step of forming N– layer 105 may be omitted.

The method may also include, in addition to forming P-well, N-well, and gate electrode 1061, forming sidewall spacers, LDD process, and the like that use known CMOS manufacturing processes, and won't be described herein for the sake of brevity.

In the Figures, N– layer 105 formed through N-type ion implantation in regions between deep trench isolations 105 (FIG. 1F-1) and in regions between shallow trench isolation 104 (FIG. 1F-2) is only partially shown for the sake of clarity.

The method further includes forming source 1062 and drain 1063 of the CMOS device in peripheral region 1002, forming P+ layer 107 in the epitaxial layer 102 of diode array region 1001, and forming an N+ layer 108 as a contact region in peripheral region 1002, as shown in FIG. 1G (step A7).

In an embodiment, forming source 1062 and drain 1063 of the CMOS device includes performing a P+ ion implantation and an N+ ion implantation. The P+ ion implantation of forming source 1062 and drain 1063 can be concurrently performed with the P+ ion implantation of forming P+ layer 107 in the epitaxial layer. The N+ ion implantation of the peripheral region can also be concurrently performed with the N+ ion implantation of forming N+ layer 108 in the diode array region. The P+ layer 107 is a shallow junction having a depth of less than 1 micron (um). In some embodiment, the depth of the shallow junction can be achieved in tens of nanometers (nm).

The method further includes forming bit lines 110 and word lines 112, bit lines 110 are connected with P+ layer 107, and word lines 112 are connected with buried N+ layer 101, as shown in FIG. 1H (step A8).

In an exemplary embodiment, bit lines 110 are connected with P+ layer 107 through contact holes 109, word lines 112 are connected with N+ layer 101 through contact holes 111, which are connected to a metal line disposed in the same layer as bit line 110 and N+ contact region 108, as shown in FIG. 1H.

In embodiments of the present invention, P+ layer 107 in the epitaxial layer 102 and buried N+ layer 101 together form a selector diode. Each diode is surrounded by deep trench isolations 103 and shallow trench isolations 104 and isolated by the double trench isolations. In other words, each diode is isolated from adjacent diodes or from other devices.

According to the present invention, the diodes can be used as selectors of the phase change memory device. The diodes can be manufactured using conventional CMOS manufacturing processes, thereby simplifying the manufacturing process of the semiconductor device and reducing the thermal budget.

Furthermore, conventional techniques require to manufacture the CMOS device first following by the manufacturing of the diodes. The conventional manufacturing process of the diode may involve ion implantation (such as implanting As ions) that adversely affects the CMOS device. According to embodiments of the present invention, the diode and the CMOS device can be concurrently manufactured, thereby avoiding adverse effects on the CMOS device and improving the performance of the semiconductor integrated circuit.

FIG. 2 is a flow chart of a method 210 for manufacturing a semiconductor device according to an embodiment of the present invention. Method 210 includes:

S101: provide a P-type semiconductor substrate, and define a diode array region and a peripheral region;

S102: form a buried N+ layer in the diode array region using an ion implantation process and an annealing process;

S103: form an epitaxial layer on the buried N+ layer;

S104: form a deep trench isolation along the column (e.g., word line) direction in the diode array region, the deep trench isolation goes through at least the epitaxial layer and the buried N+ layer;

S105: form a shallow trench isolation along the row (e.g., bit line) direction in the peripheral region, the shallow trench isolation has a depth that is at least greater than the thickness of the epitaxial layer;

S106: form a well region and a gate electrode of a CMOS device in the peripheral region;

S107: form a source and a drain of the CMOS device, form a P+ layer in the epitaxial layer of the diode array region, and an N+ layer as a contact region in the peripheral region.

Second Embodiment

FIGS. 3A, 3B, and 3C are simplified cross-sectional views of the respective diode array region along the bit line direction, the word line direction, and peripheral region of a semiconductor device according to a second embodiments of the present invention. As shown, the semiconductor device includes a p-type semiconductor substrate 100, a diode array region, and a peripheral region defined in semiconductor substrate 100. The diode array region includes a plurality of diodes 200 as selector switches for a phase change memory and deep trench isolations 103 and shallow trench isolations 104 disposed around the diodes 200. Each diode 200 is surrounded by a double isolation structure comprising deep trench isolations 103 and shallow trench isolations 104.

In this embodiment, the peripheral region is a region for one or more CMOS devices, as shown in FIG. 3C. The area marked by dashed lines includes a diode 200, however, the area may not include all specific structure of the diode 200.

In an embodiment, diode 200 includes an N+ buried layer 101 disposed in the semiconductor substrate and a P+ layer 107 disposed on N+ buried layer 101, as shown in FIGS. 3A and 3B. In a specific embodiment, diode 200 may also include an N− layer 105 disposed between N+ buried layer 101 and P+ layer 107 to improve the performance of the semiconductor device. N− layer 105 is used to suppress the reverse leakage current of diode 200.

The semiconductor may include bit lines 110 and word lines 112. Bit lines 110 are electrically connected with P+ layer 107, word lines 112 are electrically connected with N+ buried layer 101.

In an embodiment, the semiconductor may further include a deep trench isolation completely surrounded the diode array to isolate the diode array from the peripheral region (not shown). The deep trench isolation that completely surrounds the peripheral region can effectively isolate the diode array region from the peripheral region, thereby preventing interference between the diode array region and the peripheral region, to achieve a better performance of the semiconductor device.

In an embodiment, the semiconductor may further include CMOS devices 300 and shallow trench isolations 104 disposed in the peripheral region. CMOS devices 300 may be used to implement various signal processing functions, data storages, data computations, other functions, and any combinations thereof. The COS devices and other structures have been described in sections above and will not be described herein for brevity.

According to the present invention, the diode that is used a selector switch for a phase change memory is isolated by a double (deep and shallow) trench isolation structure. Thus, the selector switch has a large drive current and high switching speed. The diode as a selector switch can be manufactured using conventional CMOS process techniques and can be concurrently processed with the CMOS devices, thereby simplifying the manufacturing process and reducing production costs.

Third Embodiment

This embodiment provides an electronic device that includes the semiconductor device described in the second embodiment and manufactured according to the first embodiment. Because the semiconductor device according to the embodiments described above has a large drive current and a fast switching speed, the electronic device according to this embodiment also includes similar advantages as described above.

The electronic device may be a mobile phone, tablet PC, laptop, netbook, game console, DVD player, GPS device, voice recorder, MP3, MP4, or other electronic products.

The preferred embodiments of the present invention have been described for illustrative modification purposes, and those skilled in the art will appreciate that various modifications, additions and substitutions are possible, without departing from the scope and spirit of the invention as disclosed in the appended claims.

What is claimed is:

1. A method of manufacturing a semiconductor device, the method comprising:
   providing a p-type semiconductor substrate;
   defining a diode array region and a peripheral device region on the p-type semiconductor substrate, wherein defining the diode array region and the peripheral device region on the p-type semiconductor substrate comprising:
   forming a groove having sidewalls and a bottom in the p-type semiconductor substrate as the diode array region and a region outside the groove as the peripheral device region;
   forming a N+ buried layer in the diode array region by performing an ion implantation process and an annealing process;
   forming a semiconductor epitaxial layer on the N+ buried layer;
   forming a deep trench isolation through the semiconductor epitaxial layer and the N+ buried layer into a portion of the p-type semiconductor substrate in a first direction;
   forming a shallow trench isolation in the diode array region in a second direction and a shallow trench isolation in the peripheral region in the second direction, the shallow trench isolation having a depth equal to or greater than a thickness of the semiconductor epitaxial layer;
   forming a N-well region in the p-type semiconductor substrate and a gate electrode of a CMOS device in the peripheral region;
   forming a source and a drain of the CMOS device in the N-well region;
   forming a P+ layer in the semiconductor epitaxial layer; and
   forming N+ contact regions in the diode array region and in the peripheral device region.

2. The method of claim 1, wherein the groove has a depth in a range between 100 nm and 600 nm, and the sidewalls intercept the bottom at an angle between 80 and 90 degrees.

3. The method of claim 1, wherein performing an ion implantation process and an annealing process comprises:
   forming a lightly doped P-type material on a portion of the diode array region;
   forming a heavily doped N-type material on the portion of the diode array region; and
   activating the lightly doped P-type material and the heavily doped N-type material by annealing to form the N+ buried layer.

4. The method of claim 3, wherein the lightly doped P-type material comprises B, BF2, or any combinations thereof; and the heavily doped N-type material comprises As, P, Sb, or any combinations thereof; and
   the annealing is at a temperature between 950° C. and 1150° C. and with a time duration between 10 seconds and 7200 seconds.

5. The method of claim 1, wherein forming the semiconductor epitaxial layer comprises a deposition process at a temperature in a range between 950° C. and 1100° C. and with dimethyl dichlorosilane as a reaction gas.

6. The method of claim 1, wherein forming the semiconductor epitaxial layer comprises a deposition process at a temperature in a range between 500° C. and 900° C. and with silane or dimethyl dichlorosilane as a reaction gas.

7. The method of claim 1, wherein the deep trench isolation comprises undoped polysilicon layer and an oxide layer on the undoped polysilicon layer.

8. The method of claim 1, forming the deep trench isolation comprises:
   concurrently surrounding the diode array region with the deep trench isolation to isolate the diode array region from the peripheral region.

9. The method of claim 1, wherein the shallow trench isolation in the diode array region and the shallow trench isolation in the peripheral are concurrently formed.

10. The method of claim 1, further comprising, after forming the shallow trench isolation and prior to forming the P+ layer in the semiconductor epitaxial layer:
    forming an N-type layer disposed between the N+ buried layer at a bottom and the P+ layer at a top.

11. The method of claim 10, wherein the N-type layer is formed by implanting an N− dopant into the semiconductor epitaxial layer or by diffusing the N+ buried layer.

12. The method of claim 10, wherein the source and the drain of the CMOS device is formed concurrently with forming a P+ in the semiconductor epitaxial layer or the source and the drain of the CMOS device is formed concurrently with forming the N+ buried layer in the diode array region.

13. The method of claim 1, wherein the P+ layer is a shallow junction.

14. The method of claim 1, further comprising:
    forming a bit line and a word line;
    connecting the bit line with the P+ layer; and
    connecting the word line with the N+ buried layer.

* * * * *